(12) United States Patent
Miyake

(10) Patent No.: US 10,218,929 B2
(45) Date of Patent: Feb. 26, 2019

(54) IMAGING DEVICE

(71) Applicant: Panasonic Intellectual Property Management Co., Ltd., Osaka (JP)

(72) Inventor: Yasuo Miyake, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/036,644

(22) Filed: Jul. 16, 2018

(65) Prior Publication Data

US 2018/0324375 A1 Nov. 8, 2018

Related U.S. Application Data

(63) Continuation of application No. 15/861,992, filed on Jan. 4, 2018, now Pat. No. 10,051,219, which is a
(Continued)

(30) Foreign Application Priority Data

Jan. 22, 2016 (JP) .................................. 2016-010610

(51) Int. Cl.
*H01L 27/30* (2006.01)
*H04N 5/374* (2011.01)
(Continued)

(52) U.S. Cl.
CPC ........ *H04N 5/374* (2013.01); *H01L 27/14636* (2013.01); *H01L 27/307* (2013.01); *H04N 5/378* (2013.01)

(58) Field of Classification Search
CPC . H04N 5/374; H01L 27/14636; H01L 27/307; H01L 27/378
(Continued)

(56) References Cited

U.S. PATENT DOCUMENTS 8,054,356 B2 11/2011 Ota
8,324,626 B2 12/2012 Kimura et al.
(Continued)

FOREIGN PATENT DOCUMENTS

JP H02-194779 A 8/1990
JP 2005-303586 A 10/2005
(Continued)

OTHER PUBLICATIONS

Notice of Allowance issued in U.S. Appl. No. 15/405,408 dated Oct. 4, 2017.
(Continued)

*Primary Examiner* — Pritham D Prabhakher
(74) *Attorney, Agent, or Firm* — McDermott Will & Emery LLP

(57) ABSTRACT

An imaging device including a pixel which includes a photoelectric converter having a first electrode, a second electrode, and a photoelectric conversion layer between the first electrode and the second electrode, the first photoelectric converter generating signal charge; a charge storage region coupled to the first electrode, the charge storage region accumulating the signal charge; and a transistor which outputs a signal according to the signal charge accumulated in the charge storage region. The imaging device further including first voltage supply circuitry for supplying a first voltage that is positive and a second voltage that is less than the first voltage, the first voltage supply circuitry supplies the first voltage to the second electrode in a first period when the charge storage region accumulates the signal charge, and the first voltage supply circuitry supplies the second voltage to the second electrode in a second period different from the first period.

18 Claims, 7 Drawing Sheets

Related U.S. Application Data continuation of application No. 15/405,408, filed on Jan. 13, 2017, now Pat. No. 9,894,303.

(51) Int. Cl.
*H04N 5/378* (2011.01)
*H01L 27/146* (2006.01)

(58) Field of Classification Search
USPC ........................................................ 348/239
See application file for complete search history.

(56) References Cited

U.S. PATENT DOCUMENTS

| | | | |
|---|---|---|---|
| 8,384,085 B2 | 2/2013 | Kimura et al. | |
| 8,432,389 B2* | 4/2013 | Yamamoto | G09G 3/3233 345/204 |
| 8,493,489 B2* | 7/2013 | Oike | H04N 5/2176 348/241 |
| 8,564,531 B2 | 10/2013 | Ozawa | |
| 8,759,132 B2 | 6/2014 | Kimura et al. | |
| 9,197,830 B2 | 11/2015 | Mori et al. | |
| 9,386,248 B2* | 7/2016 | Ohtsuki | H01L 27/14603 |
| 9,773,825 B2* | 9/2017 | Hirase | H01L 27/14614 |
| 9,781,374 B2* | 10/2017 | Hashimoto | H04N 5/37452 |
| 2007/0170478 A1 | 7/2007 | Araki | |
| 2008/0211954 A1 | 9/2008 | Ota | |
| 2010/0224880 A1 | 9/2010 | Kimura | |
| 2011/0031498 A1 | 2/2011 | Kimura et al. | |
| 2011/0031499 A1 | 2/2011 | Kimura et al. | |
| 2011/0049661 A1* | 3/2011 | Maehara | H01L 27/307 257/432 |
| 2011/0187756 A1 | 8/2011 | Ono | |
| 2011/0216212 A1* | 9/2011 | Watanabe | H04N 5/2353 348/222.1 |
| 2011/0291708 A1 | 12/2011 | Ozawa | |
| 2012/0242871 A1 | 9/2012 | Iwashita et al. | |
| 2012/0318959 A1* | 12/2012 | Yamaguchi | H01L 27/14632 250/208.1 |
| 2013/0082166 A1 | 4/2013 | Sugawara et al. | |
| 2013/0095588 A1 | 4/2013 | Kimura et al. | |
| 2013/0277536 A1* | 10/2013 | Mizuno | H01L 27/1461 250/208.1 |
| 2014/0139712 A1* | 5/2014 | Yamamoto | H01L 27/14632 348/296 |
| 2014/0146211 A1 | 5/2014 | Mori et al. | |
| 2014/0160416 A1 | 6/2014 | Wang et al. | |
| 2014/0231782 A1 | 8/2014 | Imai et al. | |
| 2014/0367581 A1 | 12/2014 | Fujimura | |
| 2015/0009397 A1* | 1/2015 | Yamamoto | H04N 5/2353 348/367 |
| 2015/0280155 A1 | 10/2015 | Tamaki et al. | |
| 2016/0037113 A1* | 2/2016 | Hashimoto | H04N 5/37452 348/308 |

FOREIGN PATENT DOCUMENTS

| | | |
|---|---|---|
| JP | 2005-354640 A | 12/2005 |
| JP | 2013-084789 A | 5/2013 |

OTHER PUBLICATIONS

Notice of Allowance issued in corresponding U.S. Appl. No. 15/861,992 dated Apr. 18, 2018.

* cited by examiner

IMAGING DEVICE

This application is a Continuation of U.S. patent application Ser. No. 15/861,992 filed on Jan. 4, 2018, which is a Continuation of U.S. patent application Ser. No. 15/405,408 filed on Jan. 13, 2017, now U.S. Pat. No. 9,894,303, which in turn claims the benefit of Japanese Application No. 2016-010610, filed on Jan. 22, 2016, the entire disclosures of which Applications are incorporated by reference herein.

BACKGROUND

1. Technical Field

The present disclosure relates to an imaging device.

2. Description of the Related Art

Imaging elements that include an organic photoelectric conversion layer have been developed. Japanese Unexamined Patent Application Publication No. 2013-84789 discloses that after-image is likely to occur when high-luminance light enters an organic photoelectric conversion layer (hereinafter, this phenomenon is referred to simply as "high-luminance after-image") because signal charge generated in the organic photoelectric conversion layer migrates inside the organic photoelectric conversion layer at a low speed. After-image is caused by the generation of residual charge. For limiting the generation of residual charge, it is desirable not to arrange wires immediately below the gaps between pixel electrodes. Not arranging wires immediately below the gaps between pixel electrodes increases the strength of the electric field oriented toward the pixel electrodes in portions of the organic photoelectric conversion layer which correspond to the gaps between the pixel electrodes. This reduces the amount of time required for the signal charge being collected by the pixel electrodes and the occurrence of high-luminance after-image.

SUMMARY

A reduction in the occurrence of high-luminance after-image in imaging elements has been anticipated.

One non-limiting and exemplary embodiment provides an imaging device including a pixel which includes a photoelectric converter having a first electrode, a second electrode, and a photoelectric conversion layer between the first electrode and the second electrode, the first photoelectric converter generating signal charge; a charge storage region coupled to the first electrode, the charge storage region accumulating the signal charge; and a transistor which outputs a signal according to the signal charge accumulated in the charge storage region. The imaging device further including first voltage supply circuitry for supplying a first voltage that is positive and a second voltage that is less than the first voltage, the first voltage supply circuitry supplies the first voltage to the second electrode in a first period when the charge storage region accumulates the signal charge, and the first voltage supply circuitry supplies the second voltage to the second electrode in a second period different from the first period.

It should be noted that general or specific embodiments may be implemented as an element, a device, an apparatus, a system, an integrated circuit, and a method, a computer program, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
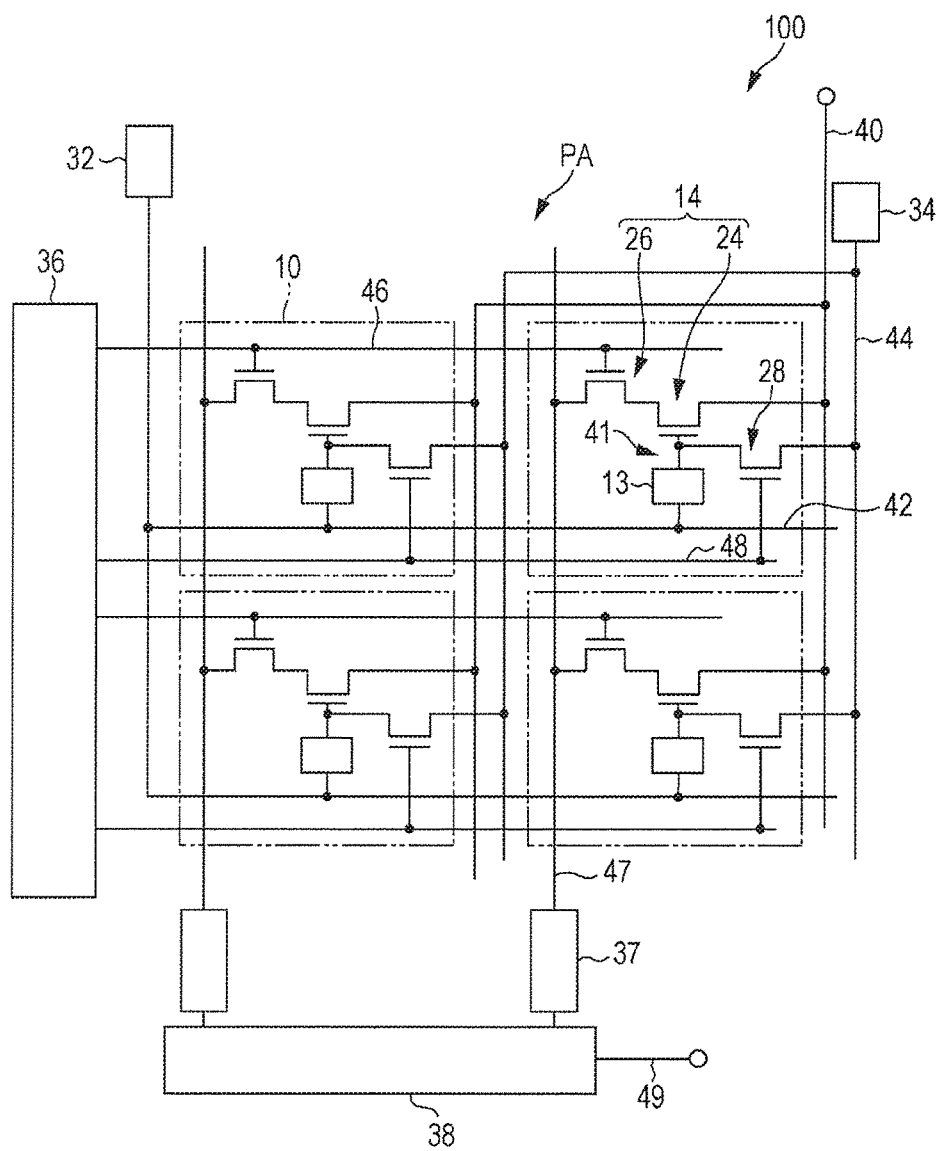
FIG. 1 is a diagram schematically illustrating an exemplary circuit structure of an imaging device according to an embodiment of the present disclosure.

The imaging element disclosed in Japanese Unexamined Patent Application Publication No. 2013-84789 employs a structure in which wires are not disposed below the gaps between the adjacent pixel electrodes in order to increase the strength of the electric field oriented toward the pixel electrodes. However, this structure increases the electric field in only regions of the organic photoelectric conversion layer which are located in the vicinity of the gaps between the pixel electrodes, and does not always reduce the amount of time required for all the signal charge carriers generated in the organic photoelectric conversion layer being collected by the pixel electrodes. Furthermore, arranging wires in the above-described manner poses a limitation on the positions of wires and reduces the degree of flexibility in the design of an imaging element.

The inventor of the present invention focused on the fact that electron-hole pairs generated by an organic photoelectric conversion layer being irradiated with light are separated into holes and electrons upon a voltage being applied to the organic photoelectric conversion layer, and the electrons or holes are detected as signal charge. As a result, the inventor conceived that the signal charge carriers, which are holes or electrons generated in the organic photoelectric conversion layer, may be recombined with electrons or holes, that is, eliminated, when the difference in potential applied to the organic photoelectric conversion layer is set to be zero.

On the basis of the above findings, the inventor of the present invention conceived a novel imaging device that includes an organic photoelectric conversion layer. The summary of an aspect of the present disclosure is described below.

[1] An imaging device including:
one or more unit pixel cells including a first unit pixel cell,
the first unit pixel cell including
a first electrode,
a second electrode facing the first electrode, a first photoelectric conversion layer between the first electrode and the second electrode, the first photoelectric conversion layer generating first signal charge, and a first signal detection circuit connected to the first electrode, the first signal detection circuit detecting the first signal charge; and a voltage supply circuit, wherein the voltage supply circuit supplies a first voltage to the second electrode during a first period when the first unit pixel cell accumulates the first signal charge, and the voltage supply circuit supplies a second voltage to at least one of the first electrode and the second electrode during a second period other than the first period, the second period including a first moment at which a difference in potential between the first electrode and the second electrode is zero.

[2] The imaging device described in [1], comprising a first controller that causes the voltage supply circuit to supply the first voltage and the second voltage.

[3] The imaging device described in [1] or [2], wherein the first photoelectric conversion layer includes an organic semiconductor material.

[4] The imaging device described in any one of [1]-[3], wherein the second voltage changes in the second period.

[5] The imaging device described in any one of [1]-[4], wherein the one or more unit pixel cells includes a second unit pixel cell, the second unit pixel cell including
  a third electrode,
  a fourth electrode facing the third electrode,
  a second photoelectric conversion layer between the third electrode and the fourth electrode, the second photoelectric conversion layer generating second signal charge, and
  a second signal detection circuit connected to the third electrode, the second signal detection circuit detecting the second signal charge, the voltage supply circuit supplies the first voltage to the fourth electrode during a third period when the second unit pixel cell accumulates the second signal charge, the voltage supply circuit supplies the second voltage to at least one of the third electrode and the fourth electrode during the second period, the second period including a second moment at which a difference in potential between the third electrode and the fourth electrode is zero, and timing of the first moment in a frame period is different from timing of the second moment in the frame period.

[6] The imaging device described in [5], wherein the second photoelectric conversion layer includes an organic semiconductor material.

[7] The imaging device described in any one of [1]-[6], wherein the first period and the second period are included in a frame period, and the second period divides the first period into two separate periods.

[8] The imaging device described in any one of [1]-[7], wherein the one or more unit pixel cells are arranged in a two-dimensional array having rows and columns, the one or more unit pixel cells include a second unit pixel cell, the second unit pixel cell including
  a third electrode,
  a fourth electrode facing the third electrode,
  a second photoelectric conversion layer between the third electrode and the fourth electrode, the second photoelectric conversion layer generating second signal charge, and
  a second signal detection circuit connected to the third electrode, the second signal detection circuit detecting the second signal charge, a row in which the first unit pixel cell is located is different from a row in which the second unit pixel cell is located, and the first signal detection circuit outputs a signal of the first unit pixel cell at first timing in a frame period, the second signal detection circuit outputting a signal of the second unit pixel cell at second timing different from the first timing in the frame period.

[9] The imaging device described in [8], comprising a second controller that causes the first signal detection circuit to output the signal of the first unit pixel cell, and causes the second signal detection circuit to output the signal of the second unit pixel cell.

[10] An imaging device including:

a plurality of unit pixels arranged in a two-dimensional array; and a driving unit that drives the plurality of unit pixels in a rolling shutter mode during imaging, the plurality of unit pixels each including
  a photoelectric conversion layer having first and second surfaces on opposite sides thereof and including an organic semiconductor material,
  a first electrode disposed on the first surface,
  a second electrode disposed on the second surface, and
  a signal detection circuit connected to the first electrode, the signal detection circuit detecting signal charge generated in the photoelectric conversion layer, the driving unit changing a voltage applied to at least one of the first electrode and the second electrode during a predetermined period at least once every N frames such that the potential of the first electrode changes from the potential applied during imaging to a ground level, the predetermined period including a timing at which the difference in potential between the first electrode and the second electrode is zero.

The imaging device described in [10] may reduce the occurrence of high-luminance after-image while maintaining the degree of flexibility in the arrangement of wires in the unit pixels.

[11] The imaging device described in [10], wherein the driving unit changes a voltage applied to at least one of the first electrode and the second electrode of each of the plurality of unit pixels.

The imaging device described in [11] may enable the occurrence of high-luminance after-image to be reduced at a high speed.

[12] The imaging device described in [10] or [11], wherein the plurality of unit pixels include first and second pixels, and the timing at which the difference in potential between the first electrode and the second electrode of the first pixel is zero during the predetermined period and the timing at which the difference in potential between the first and second electrodes of the second pixel is zero during the predetermined period are different from each other.

The imaging device described in [12] may reduce the occurrence of high-luminance after-image even during the exposure period.

[13] The imaging device described in any one of [10]-[12], wherein the driving unit sets the predetermined period to be included in a period during which the plurality of unit pixels are exposed to light.

Embodiments of the present disclosure are described below in detail with reference to the attached drawings. In the following embodiments, general or specific examples are described. All the values, shapes, materials, components, the arrangement of the components, and the connection between the components, steps, and the order of the steps described in the following embodiments are merely an example and are not intended to limit the scope of the present disclosure. The various aspects described herein may be combined with one another unless a contradiction arises. Among the components described in the following embodiments, components that are not described in any one of the independent claims, which indicate the broadest concepts, are described as optional components. In the following description, components that have substantially the same function are denoted by the same reference numeral, and the description thereof may be omitted.

Circuit Structure of Imaging device

FIG. 1 is an exemplary circuit structure of an imaging device according to an embodiment of the present disclosure. The imaging device 100 illustrated in FIG. 1 includes a pixel array PA that includes a plurality of unit pixels 10 arranged in a two-dimensional array. FIG. 1 schematically illustrates an example where the unit pixels 10 are arranged in a matrix having two rows and two columns. Needless to say that the number and arrangement of the unit pixels 10 included in the imaging device 100 are not limited to those in the example illustrated in FIG. 1.

The unit pixels 10 each include a photoelectric conversion unit 13 and a signal detection circuit 14. As described below with reference to the drawings, the photoelectric conversion unit 13 includes two electrodes facing each other and a photoelectric conversion layer interposed therebetween and generates a signal upon receiving incident light. The photoelectric conversion unit 13 is not necessarily an element in which all the components are exclusively provided for each of the unit pixels 10. For example, some of the components of the photoelectric conversion unit 13 may extend across the plurality of unit pixels 10. The signal detection circuit 14 is a circuit that detects the signal generated by the photoelectric conversion unit 13. In this example, the signal detection circuit 14 includes a signal detection transistor 24 and an address transistor 26. The signal detection transistor 24 and the address transistor 26 are typically field-effect transistors (FETs). In the following description, the signal detection transistor 24 and the address transistor 26 are N-channel MOS transistors.

As described schematically in FIG. 1, the control terminal (i.e., the gate) of the signal detection transistor 24 is electrically connected to the photoelectric conversion unit 13. The signal charge carriers (i.e., holes or electrons) generated by the photoelectric conversion unit 13 are accumulated at a charge accumulation node 41 (also referred to as "floating diffusion node"), which is located between the gate of the signal detection transistor 24 and the photoelectric conversion unit 13. The detailed structure of the photoelectric conversion unit 13 is described below.

The imaging device 100 includes a driving unit in order to drive the pixel array PA in a rolling shutter mode. The driving unit includes a voltage supply circuit 32, a reset voltage source 34, a vertical scanning circuit 36, a column-signal processing circuit 37, and a horizontal-signal readout circuit 38. The driving unit may include a controller that controls the voltage supply circuit 32, the reset voltage source 34, the vertical scanning circuit 36, the column-signal processing circuit 37, and the horizontal-signal readout circuit 38.

The photoelectric conversion unit 13 included in each unit pixel 10 is further connected to the corresponding one of voltage control lines 42. In the example structure illustrated in FIG. 1, the voltage control lines 42 are connected to the voltage supply circuit 32. The voltage supply circuit 32 applies different voltages to the counter electrodes 12 during the exposure period and the after-image reduction period. The term "exposure period" used herein refers to a period during which positive or negative charge (i.e., signal charge) generated by photoelectric conversion is accumulated at the charge accumulation regions. This period may also be referred to as "charge accumulation period". The term "after-image reduction period" and "high-luminance after-image resetting period" used herein refer to a predetermined period in which a voltage of the first electrode, which is applied from the voltage supply circuit 32, changes so as to include timing at which the difference in potential between the first and second electrodes is zero. It is noted that the predetermined voltage is between a ground voltage and a voltage of the first electrode in operation. The voltage supply circuit 32 is not limited to a specific power source circuit. The voltage supply circuit 32 may be a circuit that generates a predetermined voltage or a circuit that converts a voltage supplied from another power source into a predetermined voltage.

The unit pixels 10 are each connected to a power source line 40, through which a power source voltage VDD is supplied. As illustrated in FIG. 1, the power source line 40 is connected to the input terminal (typically, the drain) of the signal detection transistor 24. The power source line 40 serves as a source-follower power source, which enables the signal detection transistor 24 to amplify the signal generated by the photoelectric conversion unit 13 and output the amplified signal.

The output terminal (i.e., the source) of the signal detection transistor 24 is connected to the input terminal (i.e., the drain) of the address transistor 26. The output terminal (i.e., the source) of the address transistor 26 is connected to the corresponding one of a plurality of vertical signal lines 47, which are provided for the respective columns of the pixel array PA. The control terminal (i.e., the gate) of the address transistor 26 is connected to the corresponding one of address control lines 46. Controlling the potentials of the address control lines 46 enables the data output from the signal detection transistors 24 to be each selectively read out through the corresponding one of the vertical signal lines 47.

In the example illustrated in FIG. 1, the address control lines 46 are connected to a vertical scanning circuit 36 (also referred to as "row scanning circuit"). The vertical scanning circuit 36 selects a plurality of the unit pixels 10 disposed in each row on a row-by-row basis by applying a predetermined voltage to the corresponding one of the address control lines 46. This enables the signals to be read out from the selected unit pixels 10 and enables the pixel electrodes to be reset as described below.

The vertical signal lines 47 are main signal lines through which pixel signals output from the pixel array PA are transmitted to the peripheral circuits. The vertical signal lines 47 are each connected to the corresponding one of column-signal processing circuits 37 (also referred to as "row-signal accumulation circuits"). The column-signal processing circuits 37 perform noise-reduction signal processing such as correlated double sampling, analog-digital conversion (AD conversion), and the like. As illustrated in FIG. 1, the column-signal processing circuits 37 are provided for the respective columns of the unit pixels 10 in the pixel array PA. The column-signal processing circuits 37 are connected to a horizontal signal readout circuit 38 (also referred to as "column-scanning circuit"), which sequentially reads a signal from each of the column-signal processing circuits 37 to a horizontal common signal line 49.

In the example structure illustrated in FIG. 1, the unit pixels 10 each include a reset transistor 28. The reset transistor 28 may be a field-effect transistor or the like, similarly to the signal detection transistor 24 and the address transistor 26. In the example described below, the reset transistor 28 is an N-channel MOS transistor unless otherwise specified. As illustrated in FIG. 1, the reset transistor 28 is connected to a reset voltage line 44, through which a reset voltage Vr is supplied, and to the charge accumulation node 41. The control terminal (i.e., the gate) of the reset transistor 28 is connected to the corresponding one of reset control lines 48, and the potential of the charge accumulation node 41 is reset to the reset voltage Vr by controlling the potential of the reset control line 48. In this example, the reset control lines 48 are connected to the vertical scanning circuit 36. Thus, it is possible to reset a plurality of the unit pixels 10 which are disposed in each row on a row-by-row basis by the vertical scanning circuit 36 applying a predetermined voltage to the corresponding one of the reset control lines 48.

In this example, the reset voltage line 44, through which the reset voltage Vr is supplied to the reset transistors 28, is connected to a reset-voltage supply circuit 34 (hereinafter, referred to simply as "reset voltage source"). The reset voltage source 34 may have any structure that allows a predetermined reset voltage Vr to be supplied through the reset voltage line 44 during the operation of the imaging device 100 and is not limited to a specific power source circuit, similarly to the voltage supply circuit 32 described above. The voltage supply circuit 32 and the reset voltage source 34 may be parts of a single voltage supply circuit or independent voltage supply circuits. One or both of the voltage supply circuit 32 and the reset voltage source 34 may be a part of the vertical scanning circuit 36. Alternatively, a sensitivity control voltage may be supplied from the voltage supply circuit 32 to the unit pixels 10 via the vertical scanning circuit 36, and/or the reset voltage Vr may be supplied from the reset voltage source 34 to the unit pixels 10 via the vertical scanning circuit 36.

The power source voltage VDD supplied to the signal detection circuits 14 may be used as a reset voltage Vr. In such a case, the reset voltage source 34 may also be used as a voltage supply circuit (not illustrated in FIG. 1) that supplies a power source voltage to the unit pixels 10. Furthermore, it is possible to use the power source line 40 as the reset voltage line 44, which allows the arrangement of wires in the pixel array PA to be simplified. However, setting the reset voltage Vr to be different from the power source voltage VDD supplied to the signal detection circuits 14 increases the degree of flexibility in the control of the imaging device 100.

Device Structure of Unit Pixel

Figure 2:
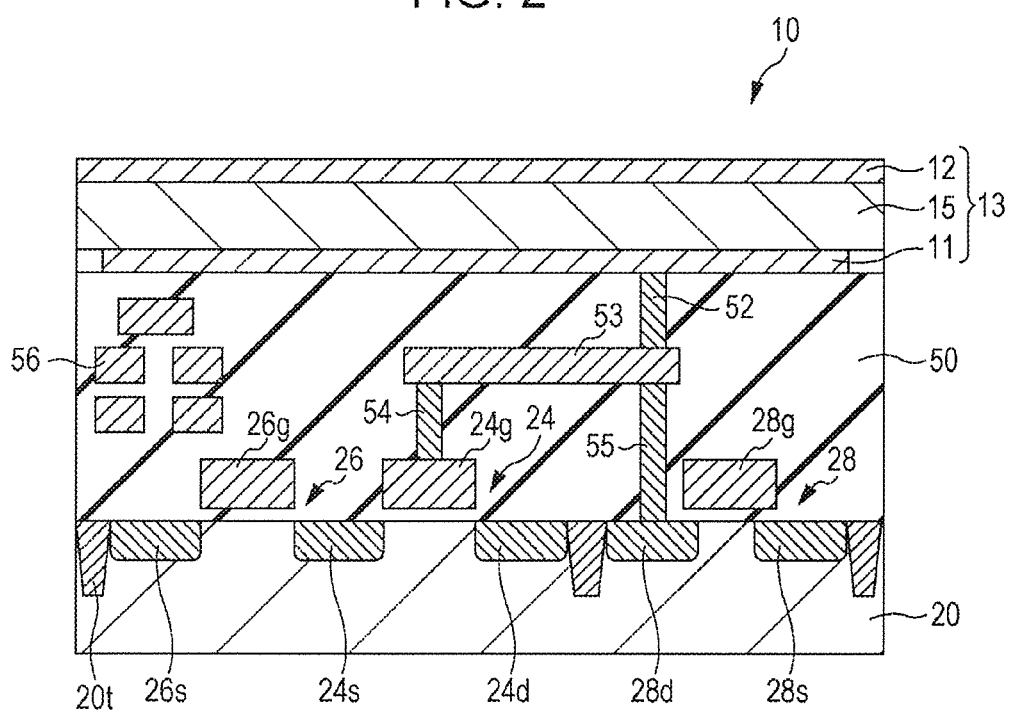
FIG. 2 is a schematic cross-sectional view of a unit pixel, illustrating an exemplary device structure of the unit pixel.

FIG. 2 schematically illustrates an exemplary device structure of the unit pixels 10. In the exemplary structure illustrated in FIG. 2, the above-described signal detection transistor 24, the address transistor 26, and the reset transistor 28 are disposed on a semiconductor substrate 20. The semiconductor substrate 20 is not limited to a substrate the entirety of which is composed of a semiconductor and may be an insulating substrate that includes a semiconductor layer on a surface thereof, the surface being on the same side as the photoelectric conversion unit 13. In the example described below, a p-type silicon (Si) substrate is used as a semiconductor substrate 20.

The semiconductor substrate 20 includes impurity regions (in this example, n-type regions) 26s, 24s, 24d, 28d, and 28s. The semiconductor substrate 20 also includes element separation regions 20t in order to electrically separate the unit pixels 10 from one another. In this example, an element separation region 20t is also interposed between the impurity regions 24d and 28d. For forming the element separation regions 20t, for example, the injection of acceptor ions may be performed under predetermined injection conditions.

The impurity regions 26s, 24s, 24d, 28d, and 28s are typically diffusion layers formed in the semiconductor substrate 20. As schematically illustrated in FIG. 2, the signal detection transistor 24 includes impurity regions 24s and 24d and a gate electrode 24g (typically, a polysilicon electrode). The impurity region 24s serves as, for example, the source region of the signal detection transistor 24. The impurity region 24d serves as, for example, the drain region of the signal detection transistor 24. The channel region of the signal detection transistor 24 is formed between the impurity regions 24s and 24d.

Similarly to the signal detection transistor 24, the address transistor 26 includes impurity regions 26s and 24s and a gate electrode 26g (typically, a polysilicon electrode), which is connected to the corresponding one of the address control lines 46 (see FIG. 1). In this example, the signal detection transistor 24 and the address transistor 26 are electrically connected to each other by sharing the impurity region 24s. The impurity region 26s serves as, for example, the source region of the address transistor 26. The impurity region 26s is connected to the corresponding one of vertical signal lines 47, which is not illustrated in FIG. 2 (see FIG. 1).

The reset transistor 28 includes impurity regions 28d and 28s and a gate electrode 28g (typically, a polysilicon electrode) connected to the corresponding one of reset control lines 48 (see FIG. 1). The impurity region 28s serves as, for example, the source region of the reset transistor 28. The impurity region 28s is connected to the reset voltage line 44, which is not illustrated in FIG. 2 (see FIG. 1).

An interlayer insulating layer 50 (typically, a silicon dioxide layer) is disposed on the semiconductor substrate 20 so as to cover the signal detection transistor 24, the address transistor 26, and the reset transistor 28. The interlayer insulating layer 50 may include a wiring layer 56 formed therein as illustrated in FIG. 2. The wiring layer 56 is typically composed of a metal such as copper and may include wires such as the vertical signal lines 47 described above. The number of insulating sublayers constituting the interlayer insulating layer 50 and the number of sublayers constituting the wiring layer 56 formed in the interlayer insulating layer 50 may be set appropriately and not limited to those in the example illustrated in FIG. 2.

The above-described photoelectric conversion unit 13 is disposed on the interlayer insulating layer 50. In other words, in an embodiment of the present disclosure, a plurality of unit pixels 10 constituting a pixel array PA (see FIG. 1) are formed on the semiconductor substrate 20. The unit pixels 10, which are arranged on the semiconductor substrate 20 in a two-dimensional array, form a photosensitive region (i.e., a pixel region). The distance (i.e., pixel pitch) between a pair of adjacent unit pixels 10 may be about 2 μm.

The photoelectric conversion unit 13 includes a pixel electrode 11 (i.e., a first electrode), a counter electrode 12 (i.e., a second electrode), and a photoelectric conversion layer 15 interposed therebetween. In this example, the counter electrode 12 and the photoelectric conversion layer 15 are formed so as to extend across a plurality of the unit pixels 10, while each of the unit pixels 10 is provided with one pixel electrode 11. Each of the pixel electrodes 11 is electrically separated from other pixel electrodes 11 included in the adjacent unit pixels 10 by being spatially separated from them.

The counter electrode 12 is typically a transparent electrode composed of a transparent conducting material. The counter electrode 12 is disposed on a side of the photoelectric conversion layer 15 on which light enters. That is, light that have transmitted through the counter electrode 12 enters the photoelectric conversion layer 15. The wavelength of light that can be detected by the imaging device 100 is not limited to be within the wavelength range of visible light (e.g., 380 nm or more and 780 nm or less). The term "transparent" used herein refers to passing at least part of light having a wavelength that falls within the detectable wavelength range, and it is not always necessary to pass light having any wavelength that falls within the wavelength range of the visible light. Hereinafter, all electromagnetic waves including infrared radiation and ultraviolet radiation are comprehensively referred to as "light" for the sake of convenience. The counter electrode 12 may be composed of a transparent conducting oxide (TCO) such as indium tin oxide (ITO), indium zinc oxide (IZO), aluminium-doped zinc oxide (AZO), fluorine-doped tin oxide (FTO), $SnO_2$, $TiO_2$, or $ZnO_2$.

The photoelectric conversion layer 15 generates electron-hole pairs upon receiving the incident light. The photoelectric conversion layer 15 is typically composed of an organic semiconductor material. Specific examples of the material of the photoelectric conversion layer 15 are described below.

As described above with reference to FIG. 1, the counter electrode 12 is connected to the corresponding one of the voltage control lines 42, which are connected to the voltage supply circuit 32. In this example, the counter electrode 12 is formed so as to extend across a plurality of the unit pixels 10. This enables the voltage supply circuit 32 to apply a desired sensitivity control voltage to a plurality of the unit pixels 10 at a time through the voltage control lines 42. Each of the unit pixels 10 may be provided with one counter electrode 12 when a desired sensitivity control voltage can be applied from the voltage supply circuit 32. Similarly, each of the unit pixels 10 may be provided with one photoelectric conversion layer 15.

Controlling the potential of the counter electrode 12 with respect to the pixel electrode 11 enables holes or electrons of the electron-hole pairs generated in the photoelectric conversion layer 15 due to photoelectric conversion to be collected by the pixel electrode 11. For example, in the case where holes are used as signal charge carriers, controlling the potential of the counter electrode 12 to be higher than that of the pixel electrode 11 enables the holes to be selectively collected by the pixel electrode 11. In the example described below, holes are used as signal charge carriers. Needless to say that electrons may alternatively be used as signal charge carriers.

The pixel electrode 11, which faces the counter electrode 12, collects positive or negative charge generated in the photoelectric conversion layer 15 due to photoelectric conversion, by applying an appropriate bias voltage between the counter electrode 12 and the pixel electrode 11. The pixel electrode 11 is composed of a metal such as aluminium or copper, a nitride of the metal, or a polysilicon or the like which has conductivity by being doped with an impurity.

The pixel electrode 11 may have a light-blocking property. When the pixel electrode 11 is, for example, a TaN electrode having a thickness of 100 nm, the pixel electrode 11 may have a sufficient light-blocking property. Using an electrode having a light-blocking property as a pixel electrode 11 may reduce the intrusion of light that transmits through the photoelectric conversion layer 15 into the channel regions or the impurity regions of the transistors formed on the semiconductor substrate 20, which are at least one of the signal detection transistor 24, the address transistor 26, and the reset transistor 28 in this example. A light-blocking film may optionally be formed in the interlayer insulating layer 50 by using the wiring layer 56 described above. Reducing the intrusion of the light into the channel regions of the transistors formed on the semiconductor substrate 20 may limit a shift of the properties of the transistors (e.g., the fluctuations in threshold voltage). Reducing the intrusion of the light into the impurity regions formed on the semiconductor substrate 20 may limit the mixing of noises unintendedly generated by photoelectric conversion occurring in the impurity regions. Thus, reducing the intrusion of the light into the semiconductor substrate 20 increases the reliability of the imaging device 100.

As schematically illustrated in FIG. 2, the pixel electrode 11 is connected to the gate electrode 24g of the signal detection transistor 24 with a plug 52, a wire 53, and a contact plug 54. In other words, the gate of the signal detection transistor 24 is electrically connected with the pixel electrode 11. The plug 52 and the wire 53 may be composed of a metal such as copper. The plug 52, the wire 53, and the contact plug 54 constitute at least a part of the charge accumulation node 41 (see FIG. 1), which is located between the signal detection transistor 24 and the photoelectric conversion unit 13. The wire 53 may constitute a part of the wiring layer 56. The pixel electrode 11 is also connected to the impurity region 28d with the plug 52, the wire 53, and a contact plug 55. In the exemplary structure illustrated in FIG. 2, the gate electrode 24g of the signal detection transistor 24, the plug 52, the wire 53, the contact plugs 54 and 55, and the impurity region 28d, which serves as a source or drain region of the reset transistor 28, function as a charge accumulation region where the signal charge collected by the pixel electrode 11 is accumulated.

Upon the signal charge being collected by the pixel electrode 11, a voltage correspondent to the amount of signal charge accumulated at the charge accumulation region is applied to the gate of the signal detection transistor 24. The signal detection transistor 24 amplifies the voltage. The voltage amplified by the signal detection transistor 24 is selectively read out as a signal voltage via the address transistor 26.

Photoelectric Conversion Layer

An example of the photoelectric conversion layer 15 is described below.

The photoelectric conversion layer 15 typically includes a semiconductor material. In the example described below, an organic semiconductor material is used as a semiconductor material.

The photoelectric conversion layer 15 includes, for example, tin naphthalocyanine represented by General Formula (1) below (hereinafter, this tin naphthalocyanine is referred to simply as "tin naphthalocyanine").

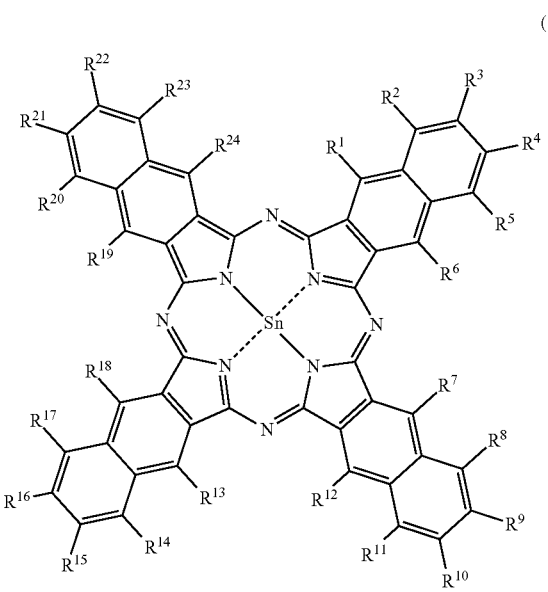

(1)

In General Formula (1), $R^1$ to $R^{24}$ each independently represent a hydrogen atom or a substituent group. The substituent group is not limited to a specific substituent group and may be selected from the following: a heavy hydrogen atom, a halogen atom, an alkyl group (including a cycloalkyl group, a bicycloalkyl group, and a tricycloalkyl group), an alkenyl group (including a cycloalkenyl group and a bicycloalkenyl group), an alkynyl group, an aryl group, a heterocyclic group, a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphate group (—OPO(OH)$_2$), a sulfate group (—OSO$_3$H), and other known substituent groups.

The tin naphthalocyanine represented by General Formula (1) above may be a commercially available one. Alternatively, the tin naphthalocyanine represented by General Formula (1) above may be synthesized, for example, by using the naphthalene derivative represented by General Formula (2) below as a starting material as described in Japanese Unexamined Patent Application Publication No. 2010-232410. The substituent groups represented by $R^{25}$ to $R^{30}$ in General Formula (2) may be the same as those represented by $R^1$ to $R^{24}$ in General Formula (1).

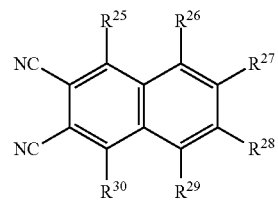

(2)

In the tin naphthalocyanine represented by General Formula (1) above, it is advantageous that 8 or more of $R^1$ to $R^{24}$ are a hydrogen atom or a heavy hydrogen atom, it is more advantageous that 16 or more of $R^1$ to $R^{24}$ are a hydrogen atom or a heavy hydrogen atom, and it is further advantageous that all of $R^1$ to $R^{24}$ are a hydrogen atom or a heavy hydrogen atom in terms of ease of control of cohesion of the molecules. The tin naphthalocyanine represented by Formula (3) below is advantageous in terms of ease of synthesis.

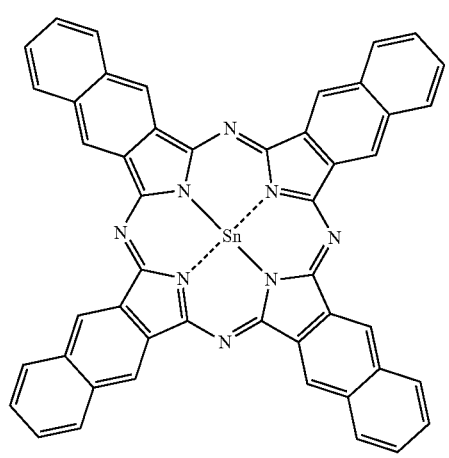

(3)

Figure 3:
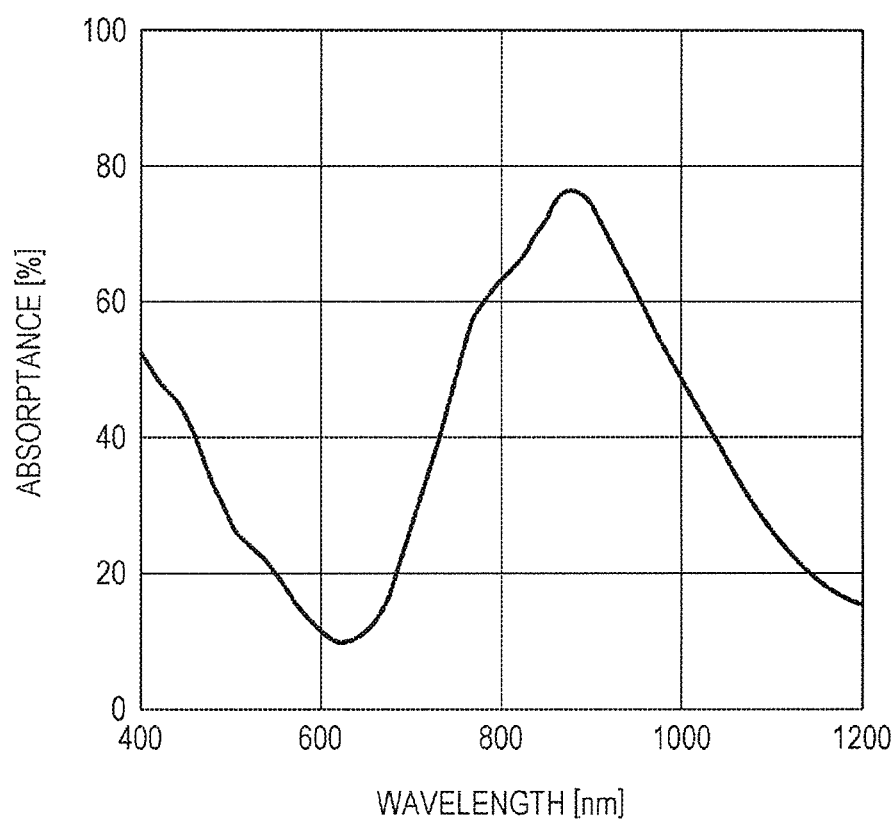
FIG. 3 is a diagram illustrating an example absorption spectrum of a photoelectric conversion layer that includes tin naphthalocyanine.

The tin naphthalocyanine represented by General Formula (1) above absorbs light having a wavelength of about 200 nm or more and 1100 nm or less. For example, the tin naphthalocyanine represented by Formula (3) has an absorption peak at a wavelength of about 870 nm as illustrated in FIG. 3. FIG. 3 illustrates an example of an absorption spectrum of a photoelectric conversion layer that includes the tin naphthalocyanine represented by Formula (3). The measurement of the absorption spectrum is made by using a sample prepared by stacking a photoelectric conversion layer (thickness: 30 nm) on a quartz substrate.

The absorption spectrum illustrated in FIG. 3 confirms that a photoelectric conversion layer composed of a material including tin naphthalocyanine absorbs light in the near-infrared region. That is, selecting a material including tin naphthalocyanine as a material of the photoelectric conversion layer 15 enables, for example, a photosensor capable of detecting the near-infrared radiation to be produced.

Figure 4:
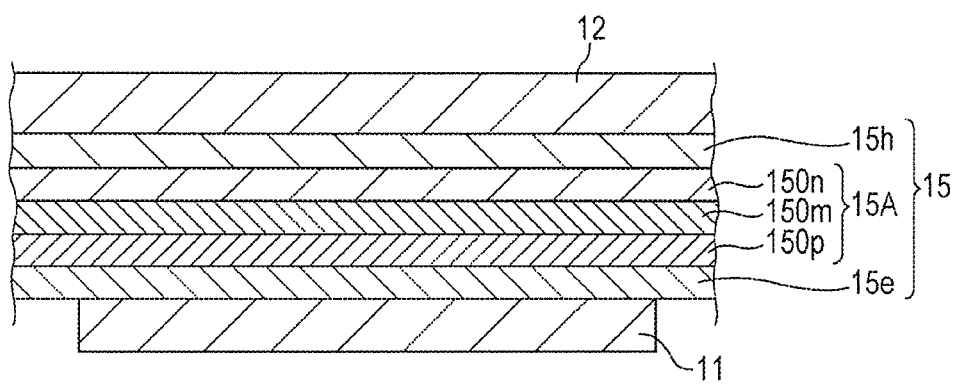
FIG. 4 is a schematic cross-sectional view of a photoelectric conversion layer, illustrating an example structure of the photoelectric conversion layer.

FIG. 4 schematically illustrates an exemplary structure of the photoelectric conversion layer 15. In the exemplary structure illustrated in FIG. 4, the photoelectric conversion layer 15 includes a hole-blocking layer 15h, a photoelectric conversion structure 15A composed of an organic semiconductor material including the tin naphthalocyanine represented by General Formula (1) above, and an electron-blocking layer 15e. The hole-blocking layer 15h is interposed between the photoelectric conversion structure 15A and the counter electrode 12. The electron-blocking layer 15e is interposed between the photoelectric conversion structure 15A and the pixel electrode 11.

The photoelectric conversion structure 15A illustrated in FIG. 4 includes at least one of a p-type semiconductor and an n-type semiconductor. In the exemplary structure illustrated in FIG. 4, the photoelectric conversion structure 15A includes a p-type semiconductor layer 150p, an n-type semiconductor layer 150n, and a mixed layer 150m interposed between the p-type and n-type semiconductor layers 150p and 150n. The p-type semiconductor layer 150p is interposed between the electron-blocking layer 15e and the mixed layer 150m and responsible for photoelectric conversion and/or hole transportation. The n-type semiconductor layer 150n is interposed between the hole-blocking layer 15h and the mixed layer 150m and responsible for photoelectric conversion and/or electron transportation. As described below, the mixed layer 150m may optionally include at least one of a p-type semiconductor and an n-type semiconductor.

The p-type and n-type semiconductor layers 150p and 150n include a p-type organic semiconductor and an n-type organic semiconductor, respectively. That is, the photoelectric conversion structure 15A includes at least one of a p-type organic semiconductor and an n-type organic semiconductor in addition to the organic photoelectric conversion material including the tin naphthalocyanine represented by General Formula (1) above.

The p-type organic semiconductor (compound) is a donor-type organic semiconductor (compound) which is likely to donate electrons to others, such as a hole-transporting organic compound. More specifically, in the case where two organic materials are used while they are in contact with each other, the term "p-type organic semiconductor (compound)" used herein refers to an organic compound having a lower ionization potential. Thus, the donor-type organic compound may be any organic compound having an electron-donating property. Examples of such an organic compound include triarylamines, benzidines, pyrazolines, styrylamines, hydrazones, triphenylmethanes, carbazoles, polysilanes, thiophenes, phthalocyanines, cyanines, merocyanines, oxonols, polyamines, indoles, pyrroles, pyrazoles, polyarylenes, condensed aromatic carbocyclic compounds (e.g., a naphthalene derivative, an anthracene derivative, a phenanthrene derivative, a tetracene derivative, a pyrene derivative, a perylene derivative, and a fluoranthene derivative), and metal complexes including a nitrogen-containing heterocyclic compound as a ligand. Examples of the donor-type organic semiconductor are not limited to the above compounds. As described above, any organic compound having a lower ionization potential than an organic compound used as an n-type (acceptor-type) compound may be used as a donor-type organic semiconductor. The above-described tin naphthalocyanine is an example of the p-type organic semiconductor material.

The n-type organic semiconductor (compound) is an acceptor-type organic semiconductor (compound) which is likely to accept electrons, such as an electron-transporting organic compound. More specifically, in the case where two organic compounds are used while they are in contact with each other, the n-type organic semiconductor (compound) is an organic compound having a larger electron affinity. Thus, any organic compound capable of accepting electrons may be used as an acceptor-type organic compound. Examples of such an organic compound include fullerene, fullerene derivatives, condensed aromatic carboncyclic compounds (e.g., a naphthalene derivative, an anthracene derivative, a phenanthrene derivative, a tetracene derivative, a pyrene derivative, a perylene derivative, and a fluoranetene derivative), five- or seven-membered heterocyclic compounds containing a nitrogen atom, an oxygen atom, or a sulfur atom (e.g., pyridine, pyradine, pyrimidine, pyridadine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridadine, triazolopyrimidine, tetrazaindene, oxadiazole, imidazopyridine, pyrrolidine, pyrrolopyridine, thiadiazolopyridine, dibenzazepine, and tribenzazepine), polyarylenes, fluorenes, cyclopentadienes, silyl compounds, and metal complexes including a nitrogen-containing heterocyclic compound as a ligand. Examples of the acceptor-type organic semiconductor are not limited to the above compounds. As described above, any organic compound having a larger electron affinity than an organic compound used as a p-type (donor-type) compound may be used as an acceptor-type organic semiconductor.

The mixed layer 150m may be, for example, a layer having a bulk heterojunction structure including a p-type semiconductor and an n-type semiconductor. For forming the mixed layer 150m including the bulk heterojunction structure, the tin naphthalocyanine represented by General Formula (1) above may be used as a p-type semiconductor material, and fullerene and/or a fullerene derivative may be used as an n-type semiconductor material. It is advantageous that the material of the p-type semiconductor layer 150p be the same as that of the p-type semiconductor material included in the mixed layer 150m. Similarly, it is advantageous that the material of the n-type semiconductor layer 150n be the same as that of the n-type semiconductor material included in the mixed layer 150m. The bulk heterojunction structure is described in detail in Japanese Patent No. 5553727, the entire contents of which are incorporated by reference herein.

By using materials appropriate to the wavelength region in which light is to be detected, it is possible to produce an imaging device having sensitivity in the desired wavelength region. The photoelectric conversion layer 15 may include an inorganic semiconductor material such as amorphous silicon. The photoelectric conversion layer 15 may include a sublayer composed of an organic material and a sublayer composed of an inorganic material. In the example described below, the photoelectric conversion layer 15 has a bulk heterojunction structure formed by codeposition of tin naphthalocyanine and $C_{60}$.

Action of Imaging device

Figure 5:
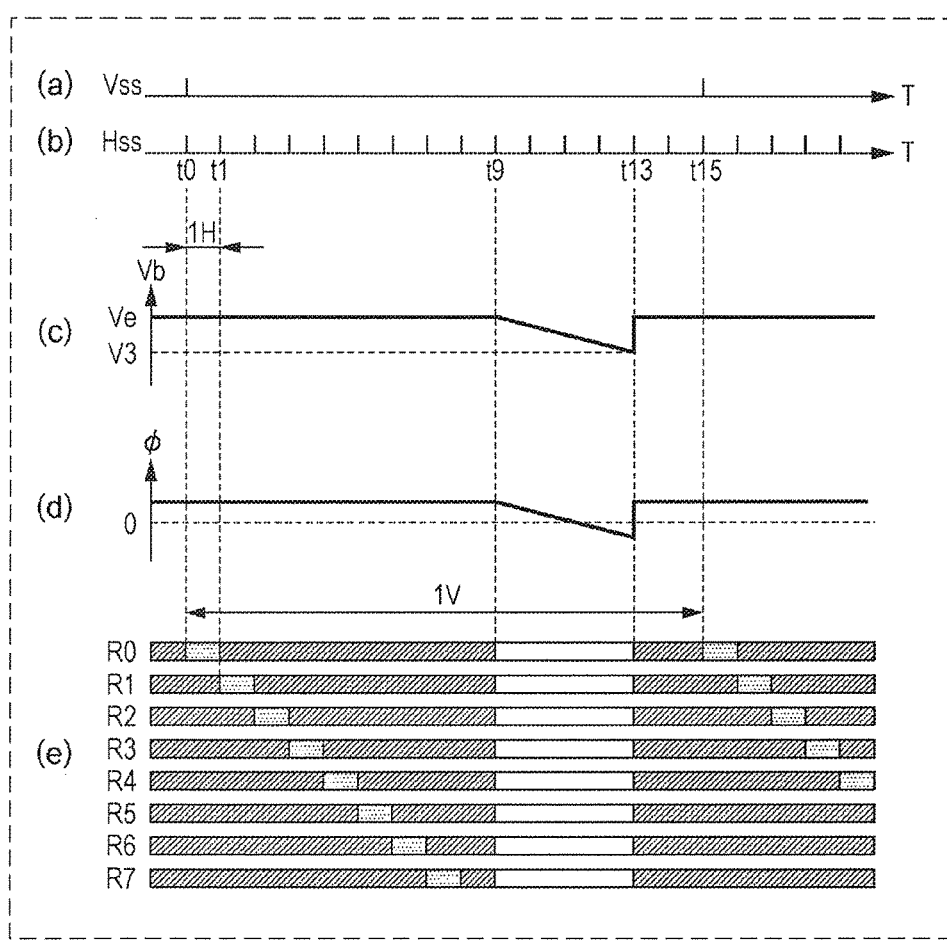
FIG. 5 includes timing charts used for explaining an example of the action of an imaging device according to an embodiment of the present disclosure.

FIG. 5 includes timing charts for explaining an example of the action of the imaging device according to an embodiment of the present disclosure. FIG. 5(a) illustrates the timing of the rise (or fall) of a vertical synchronizing signal Vss. FIG. 5(b) illustrates the timing of the rise (or fall) of a horizontal synchronizing signal Hss. FIG. 5(c) illustrates an example of a change, with time, in the voltage Vb applied from the voltage supply circuit 32 to the counter electrodes 12 via the voltage control lines 42. FIG. 5(d) illustrates a change, with time, in the potential φ of the counter electrode 12 with respect to the pixel electrode 11. FIG. 5(e) schematically illustrates the timings of resetting, exposure, and high-luminance after-image resetting of each row of the pixel array PA (see FIG. 1).

An example of the action of the imaging device 100 is described below with reference to FIGS. 1, 2, and 5. For the sake of simplicity, an example of the action of an imaging device 100 that includes a pixel array PA including pixels arranged in 8 rows in total, that is, namely, the R0-th to R7-th rows, is described below.

For acquiring an image, first, the charge accumulation region of each of the unit pixels 10 included in the pixel array PA is reset, and a pixel signal is read out from each of the reset unit pixels 10. For example, as illustrated in FIG. 5, the resetting of a plurality of pixels in the R0-th row starts in response to the vertical synchronizing signal Vss (Time t0). In FIG. 5, the rectangular portions filled with dots schematically represent a period during which a signal is read out. The readout period may include a resetting period during which the potential of the charge accumulation region of each unit pixel 10 is reset.

For resetting the pixels in the R0-th row, the address transistors 26 whose gates are connected to the specific one of the address control lines 46 which belongs to the R0-th row are turned on by controlling the potential of the address control line 46. Furthermore, the reset transistors 28 whose gates are connected to the specific one of the reset control lines 48 which belongs to the R0-th row are turned on by controlling the potential of the reset control line 48. Thus, the charge accumulation node 41 and the reset voltage line 44 are connected to each other, and a reset voltage Vr is supplied to each charge accumulation region. Specifically, the potential of the gate electrode 24g of each signal detection transistor 24 and the potential of the pixel electrode 11 of each photoelectric conversion unit 13 are reset to be the reset voltage Vr. Subsequently, a pixel signal is read out from each of the reset unit pixels 10 in the R0-th row via the corresponding one of the vertical signal lines 47. These pixel signals are correspondent to the reset voltage Vr. Subsequent to the readout of the pixel signals, the reset transistors 28 and the address transistors 26 are turned off.

In this example, the pixels in each of the R0-th to R7-th rows are reset sequentially on a row-by-row basis in response to a horizontal synchronizing signal Hss as schematically illustrated in FIG. 5. In other words, the pixel array PA is driven in a rolling shutter mode. Hereinafter, the intervals between the pulses of the horizontal synchronizing signal Hss, that is, the period from when a row is selected to when the next row is selected, is referred to as "1H period". In this example, for example, the period between Time t0 and Time t1 corresponds to the 1H period.

As illustrated in FIG. 5, the voltage Ve for imaging is applied from the voltage supply circuit 32 to each counter electrode 12 during the period (Time t0 to Time t9) from the start of the acquisition of the image to the end of the resetting of all the rows of the pixel array PA and the readout of pixel signals. The voltage Ve is, for example, about 10 V.

Subsequent to the resetting of all the rows of the pixel array PA and the readout of pixel signals, the high-luminance after-image resetting period is started in response to the horizontal synchronizing signal Hss (Time t9). In FIG. 5(e), the blank rectangular portions schematically represent the high-luminance after-image resetting period in each row. The high-luminance after-image resetting period starts when the voltage applied from the voltage supply circuit 32 to each counter electrode 12 is changed from the voltage Ve. In this embodiment, the voltage applied to each counter electrode 12 is gradually decreased from the voltage Ve to a voltage V3 over the period from the start (t9) to the end (t13) of the high-luminance after-image resetting period. Subsequently, the voltage applied from the voltage supply circuit 32 to each counter electrode 12 is increased from V3 to Ve at Time t13, at which the high-luminance after-image resetting period is terminated. The voltage V3 is typically set to a voltage at which the potential of the counter electrode 12 with respect to the pixel electrode 11 is 0 V or less, that is, for example, about 0 V. However, the voltage V3 is not limited to 0 V.

When a bias voltage of 0 V is applied to the photoelectric conversion layers 15, most of the charge accumulated at the photoelectric conversion layers 15, which causes high-luminance after-image, is eliminated. This is presumably because, when the bias voltage is 0 V, the electron-hole pairs generated in the photoelectric conversion layers 15 due to the light irradiation do not migrate toward the pixel electrodes 11 and counter electrodes 12 to separate from each other, but quickly recombine with each other and disappear. The inventors of the present invention are the first to find that setting the difference in potential between the counter electrodes 12 and the pixel electrodes 11 to 0 V, that is, setting the bias voltage applied to the photoelectric conversion layers 15 to 0 V, may enable the charge that may cause high-luminance after-image to be quickly eliminated. The elimination of the charge that may cause high-luminance after-image occurs in the photoelectric conversion layers 15 in the high-luminance after-image resetting period. Since the elimination of the charge is the cancellation of the charge which occurs inside the photoelectric conversion layers 15, the elimination of the charge hardly affects the signal charge accumulated at the charge accumulation nodes 41.

The high-luminance after-image resetting period is terminated when the voltage applied from the voltage supply circuit 32 to the counter electrodes 12 is increased to the voltage Ve (Time t13). As described above, in this embodiment of the present disclosure, selecting the voltage applied to the counter electrodes 12 between the voltage Ve and the voltage V3 enables switchover between the exposure period and the high-luminance after-image resetting period. As illustrated in FIG. 5, in this example, the start (Time t9) and the end (Time t13) of the high-luminance after-image resetting period are common to all the pixels included in the pixel array PA.

Subsequently, signal charge is read out from the pixels in each row of the pixel array PA in response to the horizontal synchronizing signal Hss. In this example, signal charge is read out from the pixels in each of the R0-th to R7-th rows sequentially on a row-by-row basis from Time t15. Hereinafter, the period from a time when pixels in a row are selected to a time when the pixels in the row are selected again may be referred to as "1V period". In this example, the period from Time t0 to Time t15 corresponds to the 1V period.

When signal charge is read out from the pixels in the R0-th row subsequent to the high-luminance after-image resetting period and the exposure period, the address transistors 26 in the R0-th row are turned on. This allows the pixel signals correspondent to the amounts of charge accumulated at the respective charge accumulation regions during the exposure period to be output through the vertical signal lines 47. Subsequent to the readout of the pixel signals, the pixels may be reset by turning on the reset transistors 28. Subsequent to the readout of the pixel signals, the address transistors 26 (and the reset transistors 28) are turned off. Subsequent to the readout of the signal charge from the pixels in each row of the pixel array PA, the difference between the signals read out at Time t0 and Time t9 is determined in order to remove fixed noises contained in the signals.

As described above, in this embodiment of the present disclosure, the start and end of the high-luminance after-image resetting period are controlled by changing the voltage Vb applied to the counter electrodes 12. That is, according to this embodiment of the present disclosure, the occurrence of high-luminance after-image may be reduced by controlling the voltage Vb, without arranging the wiring layer included in the unit pixels to be only immediately below the pixel electrodes as in Japanese Unexamined Patent Application Publication No. 2013-84789. As a result, in this embodiment of the present disclosure, it is possible to operate the imaging device at a further high speed. Furthermore, in this embodiment of the present disclosure, the degree of flexibility in the arrangement of wires in the unit pixels 10 is not reduced, which is advantageous in terms of a reduction in the size of the pixels.

In addition, it is possible to set the high-luminance after-image resetting period to be included in the exposure period, which is a period from the resetting of each of the rows of the pixel array PA to the readout of signals from the row. This may reduce the occurrence of high-luminance after-image without reducing the frame rate or the like.

For performing the exposure and the readout of signal charge in a rolling shutter mode, the pixel array PA is driven on a row-by-row basis. In other words, the timing of exposure and the timing of signal readout vary by the rows of the pixel array PA. On the other hand, the resetting of high-luminance after-image is performed at a time in all the pixels 10 included in the pixel array PA by the voltage supply circuit 32 simultaneously changing the voltage of the counter electrodes of the pixels 10. However, as described above, the resetting of high-luminance after-image does not affect the signal charge accumulated at the charge accumulation nodes 41. Thus, the amount of exposure time of the pixel array PA is the amount of the 1V period minus the amount of high-luminance after-image resetting period. The amount of time during which each row is exposed to light is equal.

The frequency of the high-luminance after-image resetting period is determined in consideration of the application or operation of the imaging device, such as the degree to which the occurrence of high-luminance after-image should be reduced. For example, a high-luminance after-image resetting period may be set every one to N frames, where N is an integer of 2 or more. The frequency of the high-luminance after-image resetting period may be changed automatically or manually by a user on the basis of incident light, the scene, and the like.

In the above-described embodiment, the voltage applied to the counter electrodes 12 is changed in the high-luminance after-image resetting period. Alternatively, the voltage applied to the pixel electrodes 11 or both the voltage applied to the pixel electrodes 11 and the voltage applied to the counter electrodes 12 may also be changed such that the voltage applied to the photoelectric conversion layers reaches 0 V at any timing within the high-luminance after-image resetting period. For example, the voltage of the charge accumulation portions, that is, the voltage of the pixel electrodes may be changed by changing the reset voltage Vr under the condition where the reset transistors 28 are on.

Other Examples of Action of Imaging device

Figure 6:
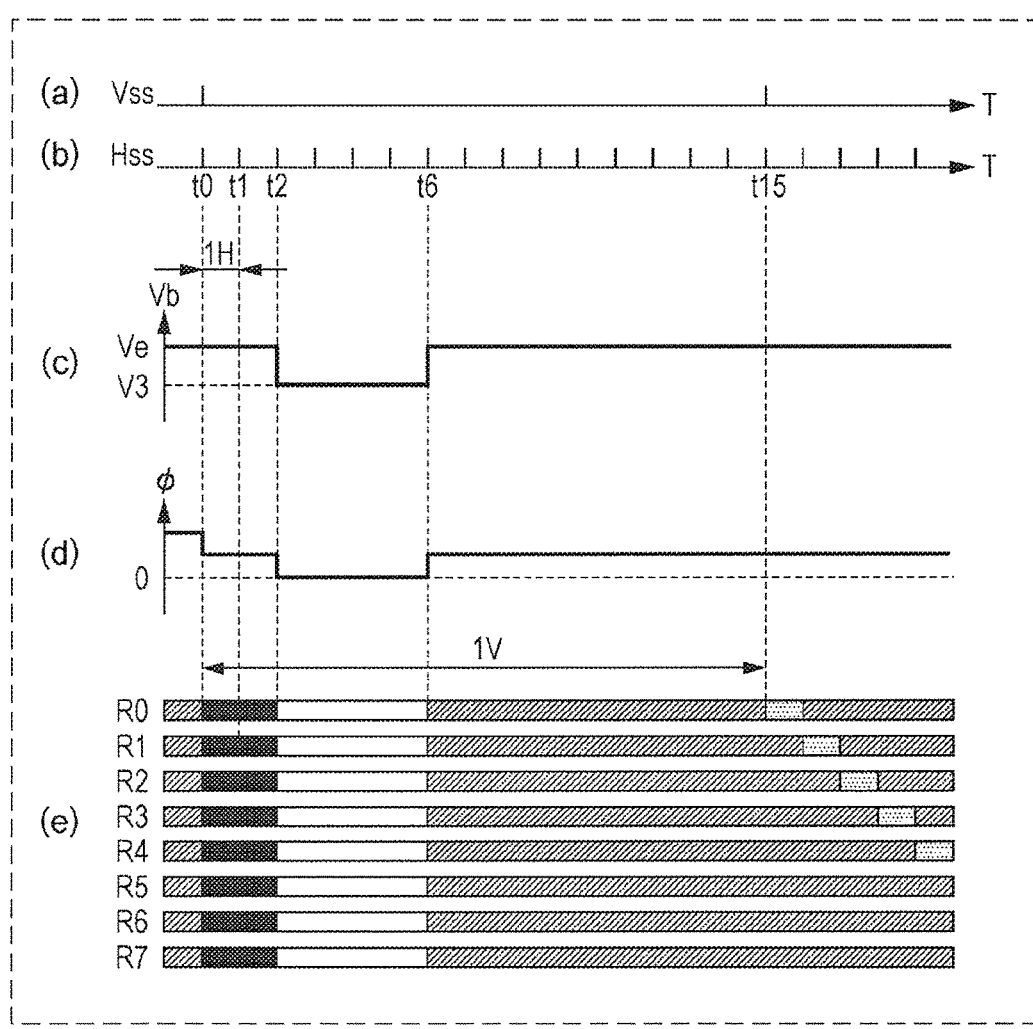
FIG. 6 includes timing charts used for explaining another example of the action of an imaging device according to an embodiment of the present disclosure.

FIG. 6 includes diagrams used for explaining another example of the action of the imaging device according to an embodiment of the present disclosure. Similarly to FIG. 5, FIG. 6(a) illustrates the timing of the rise (or fall) of the vertical synchronizing signal Vss; FIG. 6(b) illustrates the timing of the rise (or fall) of the horizontal synchronizing signal Hss; FIG. 6(c) illustrates an example of a change, with time, in the voltage Vb applied from the voltage supply circuit 32 to the counter electrodes 12 via the voltage control lines 42; FIG. 6(d) illustrates the change, with time, in the potential ϕ of the counter electrodes 12 with respect to the pixel electrodes 11; and FIG. 6(e) schematically illustrates the timing at which pixels in each row of the pixel array PA are reset, the timing at which the pixels are exposed to the light, and the timing at which the pixels are subjected to the high-luminance after-image reset.

The other example of the action of the imaging device 100 is described below with reference to FIGS. 1, 2, and 6. As in the above description, an example of the action of an imaging device 100 that includes a pixel array PA including pixels arranged in 8 rows in total, that is, namely, the R0-th to R7-th rows, is described below.

For resetting all the pixels, the charge accumulation region of each of the unit pixels 10 of the pixel array PA is reset simultaneously in all the rows. For example, as illustrated in FIG. 6, the resetting of the plurality of pixels in the R0-th to R7-th rows is started in response to a vertical synchronizing signal Vss (Time t0 to Time t2). In FIG. 6, the solid filled rectangular portions represent a resetting period during which the potentials of the charge accumulation regions of the unit pixels 10 are reset.

For resetting all the pixels, that is, the pixels in each of the R0-th to R7-th rows, the address transistors 26 whose gates are connected to the specific one of the address control lines 46 which belongs to each of the R0-th to R7-th rows are turned on by controlling the potential of the address control line 46. Moreover, the reset transistors 28 whose gates are connected to the specific one of the reset control lines 48 which belongs to each of the R0-th to R7-th rows are turned on by controlling the potential of the reset control line 48. Thus, the charge accumulation nodes 41 are connected to the reset voltage line 44, and the reset voltage Vr is supplied to the charge accumulation regions. Specifically, the potential of the gate electrode 24g of each signal detection transistor 24 and the potential of the pixel electrode 11 included in each photoelectric conversion unit 13 are reset to the reset voltage Vr. Subsequently, the reset transistors 28 and the address transistors 26 are turned off.

Subsequent to the resetting of the pixels of the pixel array PA in each row, the high-luminance after-image resetting period is started in response to the horizontal synchronizing signal Hss (Time t2).

In FIG. 6(e), the blank rectangular portions represent a period during which the high-luminance after-image is reset in the row. The high-luminance after-image resetting period is started upon the voltage applied from the voltage supply circuit 32 to the counter electrodes 12 being changed to a voltage V3 different from the voltage Ve. In this embodiment, the voltage applied to the counter electrodes 12 is changed from the voltage Ve to the voltage V3 at the time when the high-luminance after-image resetting period is started, that is, Time t2. The voltage applied to the counter electrodes 12 is maintained to be V3 during the high-luminance after-image resetting period, and changed from V3 to Ve at the time when the high-luminance after-image resetting period is terminated, that is, Time t6. The voltage V3 is typically set to a voltage at which the difference in potential between the pixel electrodes 11 and the counter electrodes 12 is 0 V, that is, for example, about 0 V. However, the voltage V3 is not limited to 0 V.

As described above, in an embodiment of the present disclosure, resetting pixels of the pixel array PA simultaneously in all the rows and immediately performing the resetting of high-luminance after-image enable the charge that may cause high-luminance after-image to be eliminated from all the pixels substantially at a time. This may enable the occurrence of high-luminance after-image to be reduced at a further high speed. In addition, it is possible to maintain the voltage applied to the photoelectric conversion layers 15 to be 0 V during the high-luminance after-image resetting period. This makes it possible to increase the amount of time during which the electron-hole pairs are capable of recombining in the photoelectric conversion layers 15 and to eliminate the charge that may cause high-luminance after-image with further certainty.

Figure 7:
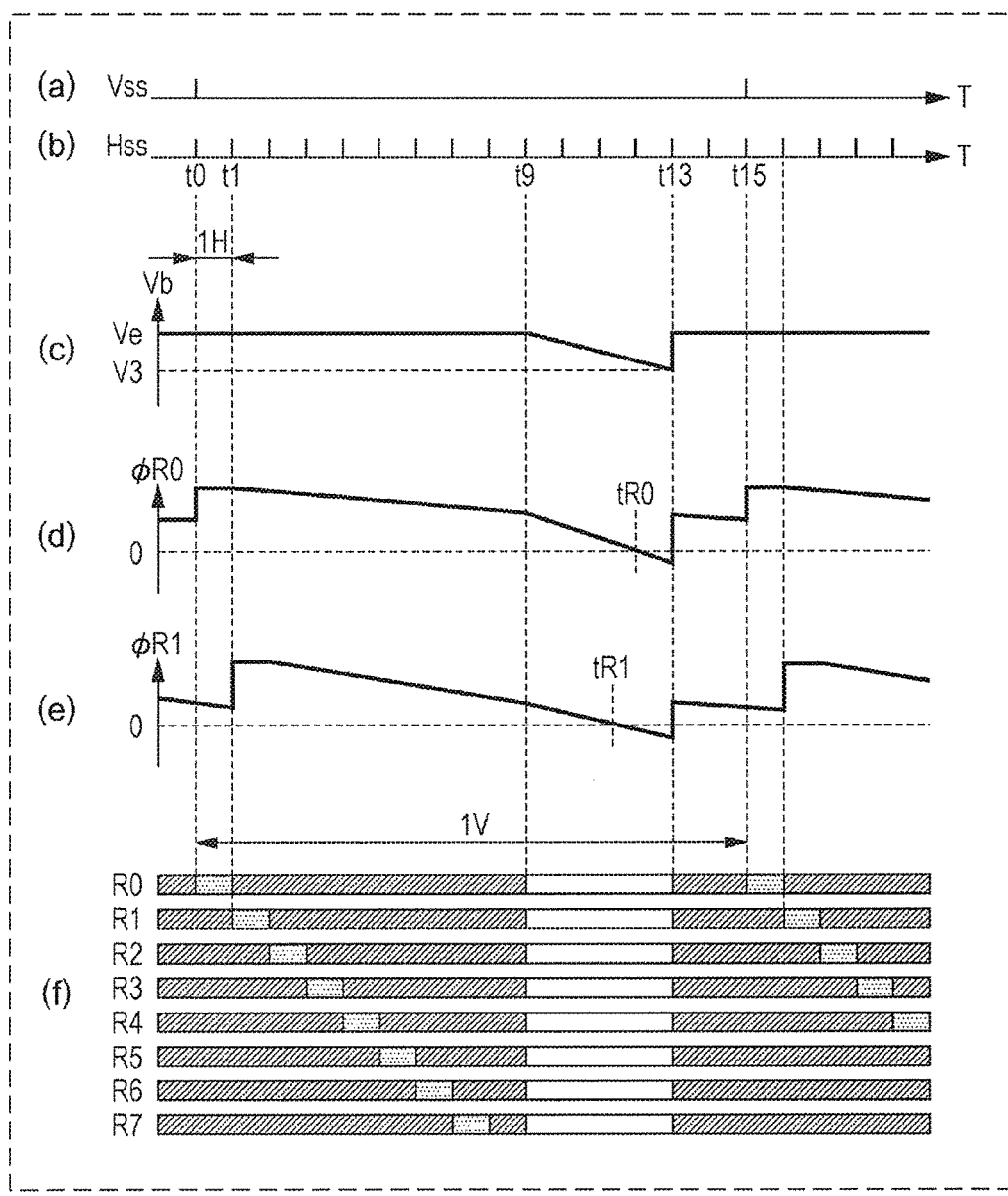
FIG. 7 includes timing charts used for explaining another example of the action of an imaging device according to an embodiment of the present disclosure.

FIG. 7 includes diagrams used for explaining further another example of the action of the imaging device according to an embodiment of the present disclosure. Similarly to FIG. 5, FIG. 7(a) illustrates the timing of the rise (or fall) of a vertical synchronizing signal Vss; FIG. 7(b) illustrates the timing of the rise (or fall) of a horizontal synchronizing signal Hss; FIG. 7(c) illustrates an example of a change, with time, in the voltage Vb applied from the voltage supply circuit 32 to the counter electrodes 12 via the voltage control lines 42; FIG. 7(d) illustrates an example of a change, with time, in the potential φR0 of the counter electrodes 12 in the R0-th row with respect to the pixel electrodes 11; FIG. 7(e) illustrates an example of the change, with time, in the potential φR1 of the counter electrodes 12 in the R1-th row with respect to the pixel electrodes 11; and FIG. 7(f) schematically illustrates the timing of the resetting of pixels in each of the rows of the pixel array PA, the timing of the exposure of the pixels, and the timing of the resetting of high-luminance after-image in the pixels.

The other example of the action of the imaging device 100 is described below with reference to FIGS. 1, 2, and 7. As in the above description, an example of the action of an imaging device 100 that includes a pixel array PA including pixels arranged in 8 rows in total, that is, namely, the R0-th to R7-th rows, is described below.

For acquiring an image, first, the charge accumulation region of each of the unit pixels 10 included in the pixel array PA is reset and a pixel signal is read out from each of the reset unit pixels 10. For example, the resetting of a plurality of pixels in the R0-th row is started in response to the vertical synchronizing signal Vss as illustrated in FIG. 7 (Time t0). In FIG. 7(f), the rectangular portions filled with dots schematically represent a period during which a signal is read out. The readout period may include a resetting period, during which the potential of the charge accumulation region of each unit pixel 10 is reset.

For resetting the pixels in the R0-th row, the address transistors 26 whose gates are connected to the specific one of the address control lines 46 which belongs to the R0-th row are turned on by controlling the potential of the address control line 46. Furthermore, the reset transistors 28 whose gates are connected to the specific one of the reset control lines 48 which belong to the R0-th row are turned on by controlling the potential of the reset control line 48. Thus, the charge accumulation nodes 41 are connected with the reset voltage line 44, and the reset voltage Vr is supplied to the charge accumulation regions. Specifically, the potential of the gate electrode 24g of each signal detection transistor 24 and the potential of the pixel electrode 11 of each photoelectric conversion unit 13 are reset to the reset voltage Vr. Subsequently, a pixel signal is read out from each of the reset unit pixels 10 in the R0-th row via the corresponding one of the vertical signal lines 47. These pixel signals are correspondent to the reset voltage Vr. Subsequent to the readout of the pixel signals, the reset transistors 28 and the address transistors 26 are turned off.

In this example, the pixels in each of the R0-th to R7-th rows are reset sequentially on a row-by-row basis in response to a horizontal synchronizing signal Hss as schematically illustrated in FIG. 7.

As illustrated in FIG. 7, the voltage Ve for imaging is applied from the voltage supply circuit 32 to each counter electrode 12 during the period (Time t0 to Time t9) from the start of the acquisition of the image to the end of the resetting of all the rows of the pixel array PA and the readout of pixel signals. The voltage Ve is, for example, about 10 V.

Subsequent to the resetting of all the rows of the pixel array PA and the readout of pixel signals, the high-luminance after-image resetting period is started in response to the horizontal synchronizing signal Hss (Time t9). In FIG. 7(f), the blank rectangular portions schematically represent the high-luminance after-image resetting period in each row. As described above with reference to FIG. 5, the high-luminance after-image resetting period is started when the voltage applied from the voltage supply circuit 32 to each counter electrode 12 is changed from the voltage Ve. Specifically, the voltage applied to each counter electrode 12 is gradually reduced from the voltage Ve to a voltage V3 over the period from the start (t9) to the end (t13) of the high-luminance after-image resetting period. Subsequently, the voltage applied from the voltage supply circuit 32 to each counter electrode 12 is increased from V3 to Ve at Time t13, at which the high-luminance after-image resetting period is terminated. The voltage V3 is typically set to a voltage at which the potential of the counter electrode 12 with respect to the pixel electrode 11 is 0 V or less, that is, for example, about 0 V. However, the voltage V3 is not limited to 0 V.

The intensity of light incident on the pixel array PA may vary significantly between the R0-th and R1-th rows. In another case, the intensity of light incident on the pixel array PA may vary significantly between Time t0 and Time t3. In such cases, the amount of charge accumulated at the charge accumulation regions of the pixels may vary significantly between the R0-th and R1-th rows. Since the potentials of the pixel electrodes 11 vary with the amount of charge accumulated at the respective charge accumulation regions, the potentials φ of the counter electrodes 12 with reference to the respective pixel electrodes 11 are different from each other at Time t9 as illustrated in FIGS. 7(d) and 7(e) even when the voltage applied to the counter electrodes 12 is the same across all the pixels. Accordingly, the timing tR0 at which the φR0 is 0 V subsequent to the start of the high-luminance after-image resetting period and the timing tR1 at which the φR1 is 0 V subsequent to the start of the high-luminance after-image resetting period are different from each other. However, even in such cases, setting V3 such that the potentials φ of the counter electrodes 12 with respect to the respective pixel electrodes 11 reach 0 V at any timing within the high-luminance after-image resetting period enables the charge that may cause high-luminance after-image to be eliminated.

The high-luminance after-image resetting period is terminated when the voltage applied from the voltage supply circuit 32 to the counter electrodes 12 is increased to the voltage Ve (Time t13). As described above, in this embodiment of the present disclosure, selecting the voltage applied to the counter electrodes 12 between the voltage Ve and the voltage V3 enables switchover between the exposure period and the high-luminance after-image resetting period.

Subsequently, signal charge is read out from the pixels in each row of the pixel array PA in response to the horizontal synchronizing signal Hss. In this example, signal charge is read out from the pixels in each of the R0-th to R7-th rows sequentially on a row-by-row basis from Time t15.

When signal charge is read out from the pixels in the R0-th row subsequent to the high-luminance after-image resetting period and the exposure period, the address transistors 26 in the R0-th row are turned on. This allows the pixel signals correspondent to the amounts of charge accumulated at the respective charge accumulation regions during the exposure period to be output through the vertical signal lines 47. Subsequent to the readout of the pixel signals, the pixels may be reset by turning on the reset transistors 28. Subsequent to the readout of the pixel signals, the address transistors 26 (and the reset transistors 28) are turned off. Subsequent to the readout of the signal charge from the pixels in each row of the pixel array PA, the difference between the signals read out at Time t0 and Time t9 is determined in order to remove fixed noises contained in the signals.

As described above, in this embodiment of the present disclosure, even when the resetting of high-luminance after-image is performed during the exposure period and the potentials of pixel electrodes vary by pixels, it is possible to create a timing at which the potential of each counter electrode with respect to the corresponding one of the pixel electrodes reaches 0 V. This enables the charge that may cause high-luminance after-image to be eliminated and reduces the occurrence of high-luminance after-image.

The imaging device according to an embodiment of the present disclosure may be used as an image sensor or the like and may be included in a camera for medical use, a camera for robot control, a security camera, a camera for automotive use, or the like. In a camera for automotive use, the imaging device according to an embodiment of the present disclosure may be used, for example, as an input device for a control device that governs control in order to achieve safe driving of a vehicle. The imaging device according to an embodiment of the present disclosure may also be used for aiding an operator to drive a vehicle safely.

What is claimed is:

1. An imaging device comprising:
    a pixel including:
        a photoelectric converter including a first electrode, a second electrode, and a photoelectric conversion layer between the first electrode and the second electrode, the first photoelectric converter generating signal charge,
        a charge storage region coupled to the first electrode, the charge storage region accumulating the signal charge, and
        a transistor having a gate coupled to the charge storage region, the transistor outputting a signal according to an amount of the signal charge accumulated in the charge storage region; and
    first voltage supply circuitry configured to supply a first voltage that is positive and a second voltage that is less than the first voltage, wherein
    the first voltage supply circuitry supplies the first voltage to the second electrode in a first period when the charge storage region accumulates the signal charge, and
    the first voltage supply circuitry supplies the second voltage to the second electrode in a second period different from the first period.

2. The imaging device according to claim 1, further comprising:
    second voltage supply circuitry configured to supply a third voltage for initializing the signal charge accumulated in the charge storage region, wherein
    the third voltage is less than the first voltage, and
    the third voltage is equal to or greater than the second voltage.

3. The imaging device according to claim 2, further comprising:
    a first controller that causes the first voltage supply circuitry to supply the first voltage and the second voltage, and
    a second controller that causes the second voltage supply circuitry to supply the third voltage.

4. The imaging device according to claim 1, further comprising:
    a first controller that causes the first voltage supply circuitry to supply the first voltage and the second voltage.

5. The imaging device according to claim 1, wherein the photoelectric conversion layer includes an organic semiconductor material.

6. The imaging device according to claim 1, wherein
    the first period and the second period are included in a frame period, and
    the second period divides the first period into two separate periods.

7. The imaging device according to claim 1, wherein the second voltage is positive.

8. The imaging device according to claim 1, wherein the second voltage is zero or negative.

9. An imaging device comprising:
    a pixel including:
        a photoelectric converter including a first electrode, a second electrode, and a photoelectric conversion layer between the first electrode and the second electrode, the first photoelectric converter generating signal charge,
        a charge storage region coupled to the first electrode, the charge storage region accumulating the signal charge, and
        a transistor having a gate coupled to the charge storage region, the transistor outputting a signal according to an amount of the signal charge accumulated in the charge storage region; and
    first voltage supply circuitry configured to supply a first voltage that is negative and a second voltage that is greater than the first voltage, wherein
    the first voltage supply circuitry supplies the first voltage to the second electrode in a first period when the charge storage region accumulates the signal charge, and
    the first voltage supply circuitry supplies the second voltage to the second electrode in a second period different from the first period.

10. The imaging device according to claim 9, further comprising:
    second voltage supply circuitry configured to supply a third voltage for initializing the signal charge accumulated in the charge storage region, wherein
    the third voltage is greater than the first voltage, and
    the third voltage is equal to or less than the second voltage.

11. The imaging device according to claim 10, further comprising:
    a first controller that causes the first voltage supply circuitry to supply the first voltage and the second voltage, and
    a second controller that causes the second voltage supply circuitry to supply the third voltage.

12. The imaging device according to claim 9, further comprising:

a first controller that causes the first voltage supply circuitry to supply the first voltage and the second voltage.

13. The imaging device according to claim 9, wherein the photoelectric conversion layer includes an organic semiconductor material.

14. The imaging device according to claim 9, wherein
the first period and the second period are included in a frame period, and
the second period divides the first period into two separate periods.

15. The imaging device according to claim 9, wherein the second voltage is negative.

16. The imaging device according to claim 9, wherein the second voltage is zero or positive.

17. An imaging device comprising:
a pixel including:
a first electrode,
a second electrode facing the first electrode,
a photoelectric conversion layer between the first electrode and the second electrode, the photoelectric conversion layer generating signal charge, and
a first signal detection circuit coupled to the first electrode, the first signal detection circuit detecting the signal charge; and
voltage supply circuitry, wherein
the voltage supply circuitry supplies a negative voltage to the second electrode in a first period when the pixel accumulates the signal charge, and
the voltage supply circuitry supplies a zero or positive voltage to the second electrode in a third period included in a second period other than the first period.

18. The imaging device according to claim 17, comprising a controller that causes the voltage supply circuitry to supply the first voltage and the second voltage.

* * * * *